(12) United States Patent
Otremba

(10) Patent No.: US 7,757,392 B2
(45) Date of Patent: Jul. 20, 2010

(54) METHOD OF PRODUCING AN ELECTRONIC COMPONENT

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 599 days.

(21) Appl. No.: 11/383,913

(22) Filed: May 17, 2006

(65) Prior Publication Data

US 2007/0266558 A1 Nov. 22, 2007

(51) Int. Cl.
*H05K 3/34* (2006.01)

(52) U.S. Cl. .......................... 29/840; 257/692; 438/123

(58) Field of Classification Search .............. 29/832, 29/834, 840, 841; 174/260, 261; 257/676, 257/684, 686, 692, 723, 778; 438/108, 123
See application file for complete search history.

(56) References Cited

U.S. PATENT DOCUMENTS

| | | | | |
|---|---|---|---|---|
| 5,619,070 | A * | 4/1997 | Kozono | 257/692 |
| 6,133,634 | A | 10/2000 | Joshi | 257/738 |
| 6,262,489 | B1 * | 7/2001 | Koors et al. | 257/778 |
| 6,582,990 | B2 | 6/2003 | Standing | 438/106 |
| 6,624,522 | B2 | 9/2003 | Standing et al. | 257/782 |
| 6,677,669 | B2 | 1/2004 | Standing | 257/685 |
| 6,683,375 | B2 | 1/2004 | Joshi et al. | 257/690 |
| 6,717,260 | B2 | 4/2004 | Pavier et al. | 257/728 |
| 6,767,882 | B1 | 7/2004 | Jagannath et al. | 510/441 |
| 6,777,800 | B2 | 8/2004 | Madrid et al. | 257/690 |
| D503,691 | S | 4/2005 | Standing et al. | D13/182 |
| 6,890,845 | B2 | 5/2005 | Standing et al. | 438/614 |
| 2003/0173684 | A1 | 9/2003 | Joshi et al. | 257/783 |
| 2004/0137724 | A1 | 7/2004 | Joshi et al. | 438/672 |
| 2005/0121784 | A1 | 6/2005 | Standing | 257/737 |
| 2006/0017174 | A1 | 1/2006 | Otremba | 257/778 |

FOREIGN PATENT DOCUMENTS

DE 10 2004 030 042 A1 1/2006

OTHER PUBLICATIONS

Andrew Sawle et al., "DirectFET—A Proprietary New Source Mounted Power Package for Board Mounted Power", International Rectifier (www.irf.com), pp. 1-5, Mar. 11, 2005.
Application Note AN-1035, "DirectFET Technology Board Mounting Application Note", International Rectifier (www.irf.com), 11 pages, Jan. 9, 2006.
FDZ291P "P-Channel 1.5 V. Specified PowerTrench BGA Mosfet", Fairchild Semiconductor, 3 pages, Feb. 2006.
FDZ208P "P-Channel 30 Volt PowerTrench BGA Mosfet", Fairchild Semiconductor, 3 pages, Feb. 2006.

(Continued)

*Primary Examiner*—Donghai D. Nguyen
(74) *Attorney, Agent, or Firm*—Banner & Witcoff, Ltd.

(57) ABSTRACT

An electronic component has at least one first vertical semiconductor power device with a first side and a second side opposing the first side. One side is attached to an electrically conductive surface by a diffusion solder bond and the opposing side is attached to a second electrically conductive surface by an electrically conductive height equalization layer.

9 Claims, 3 Drawing Sheets

OTHER PUBLICATIONS

Zhenzian Liang et al., "Planar Metallization Interconnected 3-D Multi-Chip Module", 2003 Electronic Components and Technology Conference, pp. 1090-1094.

FDZ209N "60V N-Channel PowerTrench BGA Mosfet" Fairchild Semiconductor, 3 pages, May 2004.

FDZ2553N "Monolithic Common Drain N-Channel 2.5V Specified PowerTrench BGA Mosfet", Fairchild Semiconductor, 3 pages, Feb. 2003.

Package Information, Vishay Siliconix, PolarPAK (Option L), Document No. 72945, www.vishay.com, Jun. 10, 2005.

* cited by examiner

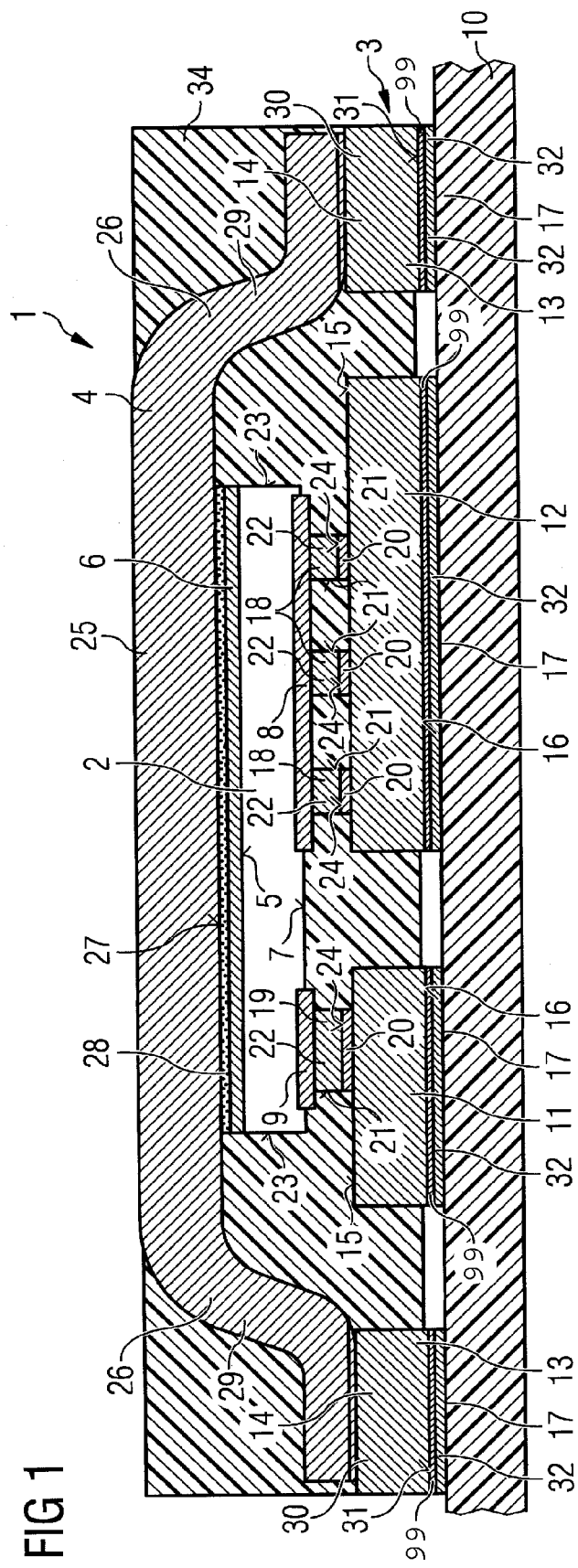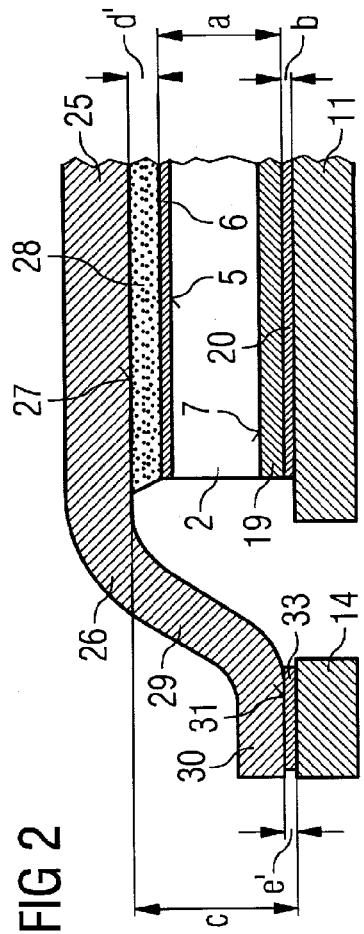

METHOD OF PRODUCING AN ELECTRONIC COMPONENT

TECHNICAL FIELD

The application relates an electronic component comprising a vertical semiconductor power device and to methods of producing the electronic component.

BACKGROUND

Electronic components including a semiconductor chip are normally provided in the form of a package which includes a housing to protect the semiconductor chip and outer contact areas such as pins or solder balls which enable the semiconductor chip to be electrically accessed from outside of the package housing.

After an electronic component is manufactured, the electronic component is normally mounted on a higher level circuit board such as a printed circuit board (PCB) by solder connections between the external contact areas of the component and the higher-level circuit board. This mounting process is normally carried out by the customer.

However, the electronic component may be damaged during the mounting process so that an electronic component which correctly functioned after manufacture no longer functions when mounted on the PCB. This is undesirable as the electronic component has to be replaced and costs are increased.

SUMMARY

An electronic component may comprise at least one first vertical semiconductor power device comprising a first side and a second side which opposes the first side. The first side may comprise at least one first load electrode and the second side may comprise at least one second load electrode. The electronic component further may comprise a first electrically conductive surface and a second electrically conductive surface. The first load electrode can be attached to the first electrically conductive surface by a diffusion solder bond and the second load electrode can be attached to the second electrically conductive surface by an electrically conductive height equalization layer.

A method may comprise providing a first vertical semiconductor power device. The first vertical semiconductor power device may comprise a first side comprising at least one first load electrode and a second side comprising at least one second load electrode. A layer of diffusion solder can be positioned on one of the first load electrode and second load electrode. A first electrically conductive surface and a second electrically conductive surface can be provided. The vertical semiconductor power device can be attached to the first electrically conductive surface by bringing the diffusion solder layer in surface-to-surface contact with the first electrically conductive surface and performing a diffusion solder process to form a diffusion solder bond between the vertical semiconductor power device and the first electrically conductive surface. After the vertical semiconductor power device is attached to the first electrically conductive surface by the diffusion solder bond, the remaining free-lying electrode can be joined to the second electrically conductive surface by one of a soft solder and an electrically conductive adhesive.

BRIEF DESCRIPTION OF THE DRAWINGS

FIG. 1 illustrates a cross-sectional view of an electronic component according to a first embodiment, FIG. 2 illustrates a cross-sectional view of a portion of the electronic component of FIG. 1.

DETAILED DESCRIPTION

Figure 3:
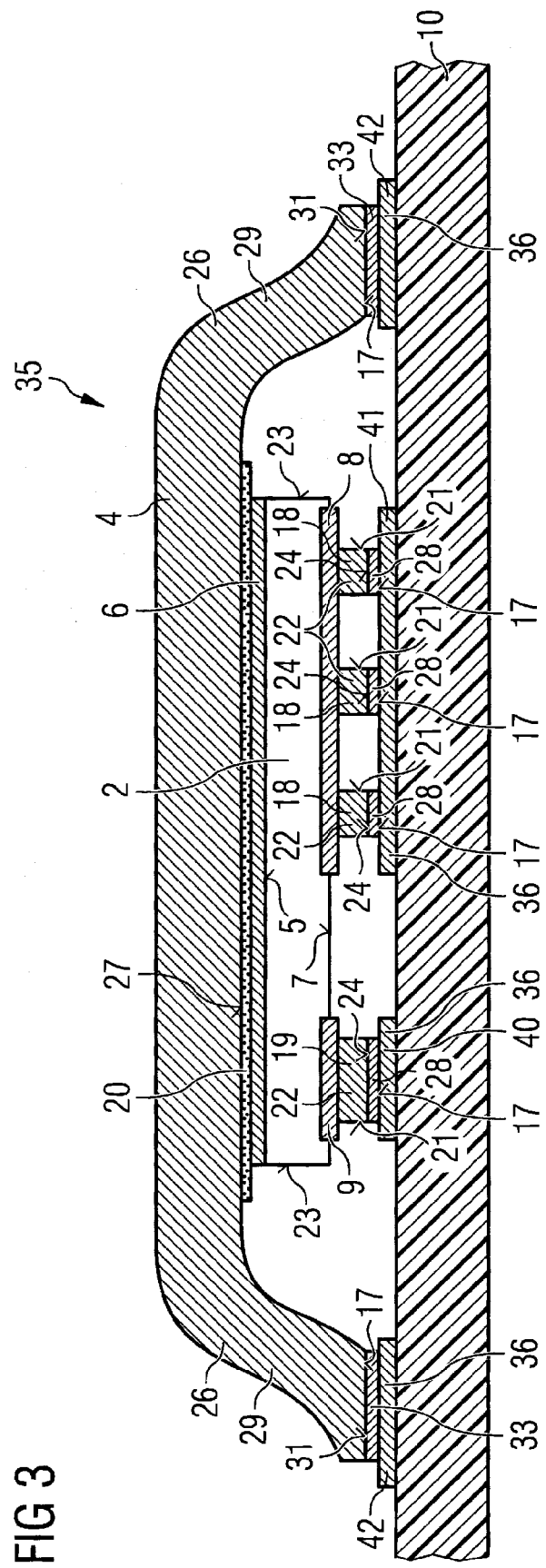
FIG. 3 illustrates a cross-sectional view an electronic component according to a second embodiment.

An electronic component comprises at least one first vertical semiconductor power device comprising a first side and a second side which opposes the first side. The first side comprises at least one first load electrode and the second side comprises at least one second load electrode. The electronic component further comprises a first electrically conductive surface and a second electrically conductive surface. The first load electrode is attached to the first electrically conductive surface by a diffusion solder bond and the second load electrode is attached to the second electrically conductive surface by an electrically conductive height equalization layer.

The two opposing sides of the vertical semiconductor power device are attached to electrically conductive surfaces by two different types of electrically conductive means. The height equalization means is not provided by a diffusion solder bond. The first side is attached to an electrically conductive surface by a diffusion solder bond, whereas the second side is attached to the second surface by the height equalization layer.

The height equalization layer is provided by a material which is sufficiently flexible during the mounting or attaching process that variations in height may be compensated for by changing the thickness of the height compensation layer during the attaching process. After the attaching process is carried out, the joint formed by the height equalization layer is solidified to provide a mechanically stable electrically conductive joint between the first side of the vertical power device and the second electrically conductive surface. The electronic component, therefore, comprises the solid height equalization layer.

The phrase "diffusion solder bond" is used in this context to denote a connection structure which is mechanically and electrically attached to a contiguous surface by a layer comprising intermetallic phases. The intermetallic phases are formed as a result of a diffusion soldering process and comprise chemical elements of a diffusion solder and of at least one contiguous material of the surface to which it is attached.

In an embodiment, an electronic component comprises at least one vertical semiconductor power device, a contact clip and an electrically conductive height equalization layer. The least one first vertical semiconductor power device comprises a first side and a second side opposing the first side. The first side comprises at least one first load electrode and a second side comprises at least one second load electrode. The vertical semiconductor device has a height between the outermost surface of the first load electrode and the outermost surface of the second load electrode of a. The contact clip comprises a flat web portion having a lower surface, the flat web portion extending into a peripheral rim portion having a foot having a lower foot surface. A height c is provided between the lower surface of the flat web portion and the lower foot surface.

In an embodiment, a diffusion solder bond is positioned on the first load electrode and comprises a thickness b and the electrically conductive height equalization layer comprising a thickness d' is positioned on the second load electrode, wherein $c \approx (a+b+d')$.

In an embodiment, a diffusion solder bond is positioned on only the first load electrode and comprises a thickness b and the electrically conductive height equalization layer comprising a thickness d' is positioned on the second load electrode, wherein c≈(a+b+d').

In an embodiment, a diffusion solder bond is positioned on the second load electrode and comprises a thickness b and the electrically conductive height equalization layer comprising a thickness d' positioned on the first load electrode, wherein c≈(a+b+d').

In an embodiment, a diffusion solder bond is positioned on only the second load electrode and comprises a thickness b and the electrically conductive height equalization layer comprising a thickness d' positioned on the first load electrode, wherein c≈(a+b+d').

The total height or thickness of the vertical semiconductor power device, the diffusion solder layer and the height equalization layer is approximately the same as the height of depth of the contact clip. Small variations from an exact equality are included. Consequently, the lower foot surface of the contact clip and the outermost surface of the first side of the vertical semiconductor power device, which is provided by the outermost surface of either a diffusion solder layer or of a height equalization layer is generally coplanar. This enables the electronic component to be reliably mounted on a substrate.

The height equalization layer also enables variations between different semiconductor devices and different clips, for example, different batches of semiconductor devices and different batches of clips, to be compensated. The overall of the products produced by the manufacturing process, after they are mounted on the external board, is improved.

The electrically conductive height equalization layer may be arranged in different positions. In an embodiment, the height equalization layer provides an electrical and mechanical connection between the vertical semiconductor power device and the contact clip which enables differences in the height of the vertical semiconductor power device and the height of depth of the contact clip to be compensated. This enables the lower foot surface of the clip and the outer most surface of the diffusions solder bond to lie in generally the same plane. The electronic component can, therefore, be mounted more reliability on a substrate.

In an embodiment, the height equalization layer is poisoned between the vertical semiconductor power device and the substrate by positioning the height equalization layer on the electrodes positioned on the first side of the vertical semiconductor power device. In this embodiment, the vertical semiconductor power device is mounted on the contact clip by a diffusion solder bond.

In an embodiment, the electronic component further comprises a substrate comprising at least one die support region and at least one substrate contact surface. The upper surface of the die support regions and of the upper surface of the substrate contact surfaces are generally coplanar. In an embodiment, the first load electrode of the semiconductor power device is mounted on a first die support region by a diffusion solder bond and the lower surface of the flat web portion is mounted on the second load electrode by the electrically conductive height equalization layer. The lower foot surface is mounted on the substrate contact surface.

In an embodiment, the second load electrode of the semiconductor power device is mounted on the flat web portion of the contact clip by a diffusion solder bond and the first load electrode is mounted on the die support region of the substrate by the electrically conductive height equalization layer. The lower foot surface is mounted on the substrate contact surface.

In an embodiment, a control electrode is positioned on the first side of the first vertical semiconductor power device and a diffusion solder bond comprising a thickness b is positioned on the control electrode.

In an embodiment, the electronic component further comprises a second vertical semiconductor power device. The second vertical semiconductor power device comprises a first surface and a second surface opposing the first surface. The first side comprises at least one first load electrode and a second side comprises at least one second load electrode. The height of the second vertical semiconductor device between the outermost surfaces of the first load electrode and the second load electrode is f. The height f may be greater or smaller than the height a of the first vertical semiconductor power device.

In an embodiment, a diffusion solder bond is positioned on the first load electrode and comprises a thickness g. The second load electrode of the second vertical semiconductor power device is mounted on the lower surface of the contact clip by a height equalization layer comprising a thickness h' and. The first load electrode of the second vertical semiconductor power device is mounted on a third die support region of the substrate by a diffusion solder bond comprising a thickness g, wherein (f+g+h')≈c≈(a+b+d').

In an embodiment, the substrate is a leadframe in the case when the first load electrode and control electrode of the first semiconductor power device are also attached to the leadframe by a diffusion solder bond. The first side of both the first and second vertical semiconductor power devices are, therefore, mounted on the surface of the leadframe by diffusion solder bonds positioned between the load electrodes positioned on the respective first sides of the two semiconductor power devices and the upper surface of the leadframe.

In a further embodiment, a layer of diffusion solder is positioned on the second load electrode and comprises a thickness g. The second load electrode of the second vertical semiconductor power device is mounted on the lower surface of the contact clip by a diffusion solder bond having a thickness g and the first load electrode is mounted on a third die support region by a height equalization layer comprising a thickness h', wherein c≈(a+b+d')≈(f+g+h').

The thickness of the first and second vertical semiconductor power devices may, therefore, differ as the difference in height may be compensated by providing a height compensation layer of a different thickness for the first and second vertical semiconductor power devices. The total thickness of each device and its respective diffusion solder bond and height equalization layer is, therefore, approximately the same. Multi chip modules may, therefore, be reliably provided in which the outer contact surfaces provided by the lower foot surfaces of the peripheral rim portion and the outermost conductive surfaces of the first side of two ore more devices are generally coplanar.

In an embodiment, the first semiconductor power device is a transistor device. The transistor device may be a MOSFET device or an IGBT device. The second semiconductor power device may be a diode. In an embodiment, the diode is electrically connected in series with the transistor device.

In an embodiment, the first vertical semiconductor power device is a MOSFET (Metal Oxide Semiconductor Field Effect Transistor) and the first load electrode is a source and the second load electrode is a drain. In an embodiment, the first vertical semiconductor power device is one of a BJT (Bipolar Junction Transistor) and an IGBT (Isolated Gate Bipolar Transistor) and the first load electrode is a collector and the second load electrode is an emitter. The control electrode is a gate.

In an embodiment, the electronic component further comprises a layer of soft solder comprising a thickness e' positioned on the lower foot surface, wherein $(c+e') \approx (a+b+d')$. In this embodiment the contact clip, therefore, has a height which is smaller than the total height of the vertical semiconductor power device, diffusion solder bond and height equalization layer. This arrangement may be used if the first semiconductor power device is mounted by diffusion solder on a substrate and the contact clip is mounted on the substrate and on the vertical semiconductor power device by soft solder layer. The soft solder layer, therefore, provides the height equalization layer.

In an embodiment, the contact clip comprises two peripheral rim portions which extend from two opposing sides of the flat web portion. In this embodiment, the lower surface of the foot of each of the two peripheral rim portions lies in generally the same plane. The contact clip, therefore, provides a can or cup which is open on two opposing sides. The contact clip has a depth from the base of the can to the upper surface of the peripheral rim portion, i.e. from the lower surface of the clip to the lower surface of the foot of the peripheral rim portion.

A method comprises providing a first vertical semiconductor power device. The first vertical semiconductor power device comprises a first side comprising at least one first load electrode and a second side comprising at least one second load electrode. A layer of diffusion solder is positioned on one of the first load electrode and second load electrode. A first electrically conductive surface and a second electrically conductive surface are provided. The vertical semiconductor power device is attached to the first electrically conductive surface by bringing the diffusion solder layer in surface-to-surface contact with the first electrically conductive surface and performing a diffusion solder process to form a diffusion solder bond between the vertical semiconductor power device and the first electrically conductive surface. After the vertical semiconductor power device is attached to the first electrically conductive surface by the diffusion solder bond, the remaining free-lying load electrode is joined to the second electrically conductive surface by one of a soft solder and an electrically conductive adhesive.

The melting point of the intermetallic phases formed during the diffusion solder process and providing the diffusion solder bond is higher than the melting point of the diffusion solder itself. Consequently, the bond which is formed as a result of the diffusion solder process has a melt temperature which is higher than the temperature at which the bond is formed. The diffusion solder bond, therefore, does not melt if the bond is subjected to a further heat treatment carried out at the diffusion soldering temperature or at a temperature below the melting point of the intermetallic phases such as a typical soft soldering temperature.

The application, therefore, provides a method by which the mechanical and electrical joint which is formed in a first stage is formed using a diffusion soldering process to produce a diffusion solder bond and the mechanical and electrical joint which is formed in a second stage, performed after the first stage, is produced using soft solder or an electrically conductive adhesive. The joint formed in the first stage is thermally and mechanically stable during the second bonding process so that the melting of the already formed joint is avoided. This order of carrying out the method steps prevents movement between the vertical semiconductor power device and the first surface during the joining of the second electrically conductive surface to the vertical semiconductor power device. Also, since further melting of the first joint is avoided, the thickness of the joint does not decrease due to lateral movement of molten or liquid material.

In an embodiment, the method also comprises the step of depositing a layer of diffusion solder on one of the first load electrode and the second load electrode of the first vertical semiconductor power device.

The diffusion solder layer may comprise Sn and one of the group consisting of Ag, Au, Cu and In or may comprise Au and Si or Ag and In. The diffusion solder layer may have a thickness b, where $0.1 \, \mu m \leq b \leq 10 \, \mu m$. The height equalization layer comprises a thickness of 50 μm to 150 μm. The thickness of the diffusion solder bond which is formed from the diffusion solder layer is approximately the same as the layer of diffusion solder initially deposited. The diffusion solder bond is formed by the solidification of the diffusion solder due to the formation of intermetallic phases. The diffusion solder layer is also relatively thin compared to the thickness of the height equalization layer and does not have the function of a height compensation layer in the sense of that provided by the flexible soft solder and electrically conductive adhesive during the attaching process which provide the height equalization layer.

In an embodiment, at least one further adhesion layer is disposed between the electrode and the diffusion solder layer. The further layer comprises one of a metal and an alloy thereof, the metal being one of the group of elements Ni, Au, Ag, Pt and Pd.

In an embodiment, the diffusion solder layer is deposited on the first load electrode and the first load electrode is attached to a leadframe providing the first electrically conductive surface by the diffusion solder process. In this embodiment, the second load electrode may be attached to a contact clip providing the second electrically conductive surface by one of a soft solder and an electrically conductive adhesive after the first load electrode is mounted on the leadframe.

In an embodiment, the diffusion solder layer is deposited on the first load electrode and the first load electrode is attached to a printed circuit board providing the first electrical conductive surface by the diffusion solder process. In this embodiment, the second load electrode may be attached to a contact clip providing the second electrically conductive surface by one of a soft solder and an electrically conductive adhesive after the first load electrode is mounted on the printed circuit board.

In an embodiment, the diffusion solder layer is deposited on the second load electrode and the second load electrode is attached to a contact clip providing the first electrically conductive surface by the diffusion solder process. In this embodiment, the first load electrode may be attached to one of a leadframe and a printed circuit board providing the second electrically conductive surface by one of soft solder and an electrically conductive adhesive.

In an embodiment, a second vertical semiconductor power device having a first surface and a second surface opposing the first surface is provided. The first side comprises at least one first load electrode and the second side comprises at least one second load electrode. A layer of diffusion solder is positioned on the first load electrode of the second vertical semiconductor power device. The second vertical semiconductor power device is mounted on a third electrically conductive surface by bringing the diffusion solder layer into surface to surface contact with the third electrically conductive surface and performing a diffusion solder process to form a diffusion solder bond before the second electrically conductive surface is attached to at least the first vertical semiconductor power device by one of soft solder and an electrically conductive adhesive.

Both the first and second vertical semiconductor power devices may be mounted on an article providing the first and third electrically conductive surfaces in one diffusion solder process of in two diffusion solder processes carried out sequentially. After all of the diffusion solder processes have been carried out, the second electrically conductive surface is attached to the remaining free-lying electrodes of the first and second vertical semiconductor power devices by soft solder of electrically conductive adhesive.

The first and second vertical semiconductor power devices may be mounted on the flat web portion of a single contact clip by diffusion solder bonds and to a substrate such as a leadframe or external printed circuit board by soft solder or electrically adhesive joints. Alternatively, the first and second vertical semiconductor power devices may be mounted or on the upper surface of a leadframe or a printed circuit board by diffusion solder bonds and to the flat web portion of a single contact clip by soft solder or electrically conductive adhesive.

In an embodiment, the first semiconductor power device is a transistor device and the second semiconductor power device is a diode.

A method comprises providing at least one vertical semiconductor power device, a contact clip and a substrate. The vertical semiconductor power device comprises a first side and a second side opposing the first side. The first side comprises at least one first load electrode and the second side comprises at least one second load electrode. The height of the vertical semiconductor power device between the outermost surface of the first load electrode and the outermost surface of the second load electrode is a. A layer of diffusion solder is positioned on the first load electrode and comprises a thickness b.

The contact clip comprises a flat web portion having a lower surface, the flat web portion extending into a peripheral rim portion having a foot having a lower foot surface. A height c is provided between the lower surface of the flat web portion and the lower foot surface, The substrate comprises at least one die support region and at least one substrate contact surface, the upper surface of the die support regions and of the contact surfaces being generally coplanar.

The first load electrode of the semiconductor power device is attached to a first die support region by a diffusion solder process. An electrically conductive height equalization layer is provided on the second load electrode, the height equalization layer comprises a thickness d on the, wherein $c<(a+b+d)$.

The total height of the vertical semiconductor power device, the diffusion solder bond and the height equalization layer is, therefore, greater than the depth or height of the contact clip.

After the diffusion solder process is completed, the lower surface of the flat web portion of the contact clip is attached to the second load electrode and by the electrically conductive height equalization layer and the lower foot surface is attached to the substrate contact surface. The contact clip is pressed and the thickness of the height equalization layer is adjusted to d', wherein $d'<d$, so that $c \approx (a+b+d')$. The total height of the vertical semiconductor power device, the diffusion solder bond and the height equalization layer is now, after the adjustment process, approximately equal to the depth or height of the contact clip.

In an embodiment, soft solder is provided as the height equalization layer and the thickness d is adjusted by heating the soft solder above its melting point while pressing the contact clip onto the height equalization layer.

In an embodiment, an electrically conductive adhesive is provided as the height equalization layer.

In an embodiment, the vertical semiconductor power device further comprises a control electrode positioned on the first side and a diffusion solder layer is positioned on the control electrode and comprises a thickness b. The height of the vertical semiconductor power device between the outermost surface of the second load electrode and the outermost surface of the control electrode is a. In this embodiment, the control electrode may be attached to a second die support region during the diffusion solder process.

In an embodiment, a further height compensation layer is positioned on the lower foot surface.

In an embodiment, a second vertical semiconductor power device is provided. The second semiconductor power device comprises a first surface and a second surface opposing the first surface. The first side comprises at least one first load electrode and a second side comprises at least one second load electrode, the height of the second vertical semiconductor power device between the outermost surface of the first load electrode and the outermost surface of the second load electrode is f. A layer of diffusion solder is positioned on the first load electrode and comprises a thickness g.

The second vertical semiconductor power device is mounted on a third die support region of the substrate by bringing the diffusion solder layer into surface to surface contact with the third die support region and performing a diffusion solder process to form a diffusion solder bond. Afterwards, a height equalization layer comprising a thickness h is positioned on the second load electrode and the second load electrode attached to the lower surface of the contact clip by the height equalization layer. The contact clip is pressed so as to adjust the thickness of the height equalization layer to a thickness h', wherein $h'<h$, so that $c \approx (f+g+h')$.

The total height of the first semiconductor power device, diffusions older layer and height equalization layer is, therefore, approximately the same as the total height of the semiconductor power device, and its respective diffusion solder bond and height compensating layer, i.e. $(f+g+h') \approx (a+b+d')$. Differences in the height of thickness of the two vertical semiconductor devices are compensated by the thickness of the height compensating layer to provide an electronic component in which the outermost contact surfaces of the electronic component are generally coplanar.

The second vertical semiconductor power device may mounted on the die support region before the second electrically conductive surface is attached to at least the first vertical semiconductor power device by one of soft solder and an electrically conductive adhesive.

In an embodiment, the first semiconductor power device is a transistor device and the second semiconductor power device is a diode.

In an embodiment, a layer of diffusion solder is positioned on the second load electrode and comprises a thickness b. The second load electrode of the semiconductor power device is attached to the lower surface of the flat web portion of the contact clip by a diffusion solder process. The electrically conductive height equalization layer comprises a thickness d and is applied to the first load electrode, wherein $c<(a+b+c)$. After the diffusion solder process is completed, the first load electrode is attached to the die support of the substrate by an electrically conductive height equalization layer. The contact clip is pressed and the thickness of the height equalization layer adjusted from d to d', wherein $d'<d$, so that $c \approx (a+b+d')$.

In an embodiment, the vertical semiconductor power device further comprises a control electrode positioned on the first side and the control electrode is attached to a second die support region of the substrate by a height equalization layer.

The electronic component further comprises, in an embodiment, a second vertical semiconductor power device. The second vertical semiconductor power device comprises a first surface and a second surface opposing the first surface. The first side comprises at least one first load electrode and a second side comprises at least one second load electrode. The height of the second vertical semiconductor power device between the outermost surfaces of the first load electrode and the second load electrode is f. In this embodiment, a layer of diffusion solder is positioned on the second load electrode and comprises a thickness g.

The second vertical semiconductor power device is mounted on the lower surface of the contact clip by bringing the diffusion solder layer into surface to surface contact with the lower surface of the contact clip and performing a diffusion solder process to form a diffusion solder bond. After the formation of the diffusion bond, a height equalization layer comprising a thickness h is positioned on the first load electrode. The first load electrode is attached to the a die support region of the substrate by the height equalization layer. The thickness h of the height equalization layer is adjusted to a thickness h', wherein h'<h, so that c≈(f+g+h').

In this embodiment, the second load electrode of both the first and second vertical semiconductor power device is mounted on the lower surface of the contact clip by a diffusion solder bond. The provision of the height equalization layer, which may comprise soft solder or an electrically conductive adhesive, on the opposing first load electrode of both the first and second vertical semiconductor power devices enables differences in height between the first and second vertical semiconductor power devices to be compensated. For example, if the second vertical semiconductor power device is the thinner than the first vertical semiconductor power device, the thickness of the height compensation layer positioned on the second vertical semiconductor power device is increased and is thicker than that positioned on the first load electrode of the first vertical semiconductor power device. Consequently, a multi-chip module is provided in which the outer contact surfaces of the component lying generally the same plane. Consequently, the module may be reliably mounted to an external substrate.

Since the two vertical semiconductor power devices are attached in the first stage to the contact clip by a diffusion solder bond, the position of the vertical semiconductor power devices does not alter during the subsequent process in which the electronic component is mounted on a printed circuit board. Since the melting point of the into metallic phases which comprise the diffusion solder bond is higher than the temperature at which they solder reflow process is, typically, carried out, melting of the already formed mechanical and electrical connections is avoided. The electronic component may be, therefore, reliably mounted on an external substrate by the customer.

The first semiconductor power device may be a transistor device and the second semiconductor power device may be a diode.

FIG. 1 illustrates a view of an electronic component 1 comprising a vertical MOSFET device 2, a leadframe 3 and a contact clip 4 according to a first embodiment.

The vertical MOSFET device 2 comprises a first lower side 7 which comprises a source electrode 8 and a gate electrode 9 and a second upper side 5 which comprises a drain electrode 6, which extends over the majority of the second side 5 of the MOSFET device 2. The first side 7 is positioned opposing the second side 5 and side faces 23 extend generally perpendicularly to the first side 7 and second side 5. The source electrode 8 is laterally much larger than the gate electrode 9. The gate electrode 9 is positioned in an edge region of the first surface 7 of the MOSFET device 2 and is surrounded on three sides by the source electrode 8 which extends over the majority of the first surface 7. The lateral arrangement of the source electrode 8 and the gate electrode 9 is not illustrated in FIG. 1.

In this context, "upper" and "lower" are defined in relation to the orientation of the electronic component 1 when it is mounted on a circuit carrier such as a printed circuit board. "Upper" is used to denote the side of the MOSFET device 2 which faces upwards and away from the printed circuit board, indicated in FIG. 1 by 10, and "lower" is used to denote the side of the MOSFET device 2 which faces towards the printed circuit board 10.

In this embodiment of the invention, the drain electrode 6 comprises a layer of aluminium with around 1% Si which is disposed directly on the upper surface 5 of the semiconductor body of the MOSFET device 2. The source electrode 8 and the gate electrode 9 are disposed directly on the lower side 7 of the semiconductor body of the MOSFET device 2 and also comprise aluminium with 1% Si. The outermost surface of the drain electrode 6 includes a thin layer (not illustrated) of an easily solderable material, such as silver.

The leadframe 3 of the electronic component 1 comprises a gate portion 11, a source portion 12 and two drain portions 13. The portions 11, 12 and 13 of the leadframe 3 are physically separate and are not physically joined. In this embodiment of the invention, the two drain portions 13 are positioned in two opposing edge regions of the electronic component 1.

The gate portion 11, the source portion 12 and the two drain portions 13 each have an upper surface 15 which faces towards the first lower surface 7 of the MOSFET device 2 and a lower surface 16 which provides an outer contact area 17 of the electronic component 1. The gate portion 11, source portion 12 and drain portions 13 of the leadframe 3 are provided by a structured metal sheet and have a thickness which is essentially the same. The upper surface 15 of the source portion 12 and the upper surface 15 of the gate portion in 11 are, therefore, essentially coplanar. The lower surface 16 of the source portion 12 and the lower surface 16 of the gate portion 11 are also essentially coplanar.

The MOSFET device 2 is mounted with its first side 7 comprising the source electrode 8 and gate electrode 9 facing the upper surface 15 of the source portion 12 and gate portion 11 the leadframe 3. The source portion 12 of the leadframe 3 is laterally larger than the source electrode 8 and protrudes laterally outside the lateral area of the MOSFET device 2. The gate portion of the leadframe 3 is also laterally larger than the gate electrode 9.

A plurality of first electrically conductive bumps 18 are disposed on the source electrode 8 and a single second electrically conductive bump 19 is arranged on the gate electrode 9. The source electrode 8 is attached, and electrically connected, to the source portion 12 of the leadframe 3 by the plurality of first electrically conductive bumps 18. The gate electrode 9 is attached and electrically connected to the gate portion 11 of the leadframe 3 by the second electrically conductive bump 19.

The electrically conductive bumps 18 and 19 are provided in the form of protrusions, each of which in this embodiment of the invention is laterally essentially square and has essentially the same height. Each electrically conductive bump 18, 19 has a metal body 22 and a distal end 24. The distal end 24 is generally planar and lies in a plane essentially parallel to the first surface 7 of the MOSFET device 2. The metal body 22 consists essentially of copper and has a height of around 50 μm.

The MOSFET device 2 has a height or thickness as measured between a point on the outermost surface of the drain electrode 6 and a second point, vertically aligned with the first point, which is poisoned on the outermost surface 24 of the metal body 22. This height is defined as a and may lie in the range 100 µm≦a≦500 µm (micrometres).

A diffusion solder bond 20 is positioned on the distal end of each of the metal bodies 20 and is positioned directly between the metal body 20 and leadframe 3. The diffusion solder bond comprises Sn and Cu and has a thickness b of approximately 5 µm. The side faces 23 of the metal body 20 remain uncovered by the diffusion solder layer.

The thickness of the MOSFET device 2, diffusion solder bond 20 are illustrated in FIG. 2. It should be noted that the figures are not drawn to scale so that relationships between the height or thickness of the various elements of the electronic component cannot be inferred solely from the figures.

The first surface 7 of the MOSFET 2 is spaced at a distance from the upper surface 15 of the leadframe 3 by the electrically conductive bumps 18, 19. This has the advantage that a smaller proportion of the heat generated by the device is dissipated into the leadframe. This reduces the amount of heat dissipated into the printed circuit board 10 and reduces the likelihood of over-heating neighbouring device mounted on the PCB.

The electrically conductive bumps 18 and 19 were deposited on the source electrode 8 and gate electrode 9 respectively by galvanic deposition. The electrically conductive bumps 18, 19 are conveniently manufactured on the wafer level for a number of MOSFET devices 2 simultaneously. After their fabrication, the wafer is singulated to provide individual MOSFET devices 2.

Firstly, a mask layer of photoresist was deposited on the first surface 7 and structured to provide a plurality of through-openings. Each through-opening extending to the source electrode 8 and gate electrode 9 on the first surface 7 of the MOSFET device 2 and having the dimensions and arrangement of the electrically conductive bumps 18, 19. The metal body 20 was then deposited into the through-openings and a layer of diffusion solder deposited on the distal end 24 of the metal bodies 20. The photo resist layer was then removed. The as-deposited layer of diffusion solder comprises Sn and Cu.

To assemble the electronic component 1, the MOSFET device 2 is mounted on the leadframe 3 by carrying out a diffusion solder process during which the as deposited diffusion solder melts and reacts with the material of the contiguous surfaces to form intermetallic phase and a diffusion solder bond 20. Since the intermetallic phases have a higher melting point than the temperature at which the diffusion older process is carried out, the diffusion solder bond 20 is created by a solidification of the diffusion solder layer.

The source electrode 8 is mounted on, and electrically connected to, the upper surface 15 of the source portion 12 by a diffusion solder bond 20. Similarly, the electrically conductive bump 19 positioned on the gate electrode 9 is electrically connected to the gate portion 11 of the leadframe 3 by a diffusion solder bond 20.

The electronic component 1 further comprises a contact clip 4 which comprises a flat web portion 25 and two peripheral rim portions 26. The flat web portion 25 is laterally larger than the MOSFET device 2 on two opposing sides of the MOSFET device 2. Therefore, a peripheral rim region 26 extends over two opposing side faces 23 of the MOSFET device 2.

The contact clip 4 has substantially a U-shape in the view of FIG. 1 and has the from of a laterally rectangular can which is open on two opposing sides. The two sides walls being provided by the two peripheral rim portions 26. Each opposing peripheral rim portion 26 comprises a leg 29 which extends downwards from the flat web portion 25 in directions towards the bottom side 27 of the flat web portion 25. The legs 29 of the peripheral rim portion 26 are spaced at a distance from two opposing side faces 23 of the MOSFET device 2. The leg 29 of each of the peripheral rim portions 26 each include a foot 30 which extends in a direction away from the side face 23 of the MOSFET device 2. The contact clip 4 has essentially a uniform thickness and may be fabricated by stamping and bending a metal foil or sheet.

The lower surface 31 of each of the feet 30 of the peripheral rim portion 26 of the contact clip 4 lies in essentially the same plane. The contact clip 4, therefore, has a height or depth between the lower surface 27 of the flat web portion 25 and lower surface 31 of the foot region 30 which is defined as c. This height is sufficiently large to accommodate the height of the MOSFET device 2 and the diffusion solder layer 20 positioned on the source electrode 8 and gate electrode 9. The height c of the contact clip 4 is, therefore, larger than the total thickness (a+b).

The drain electrode 6 is mounted on the lower surface 27 of the flat web portion 25 of the contact clip 4 by a layer of soft solder 28. The layer of soft solder 28 has a thickness d when it is deposited on either the outermost surface of the drain electrode 6 or the lower surface 27 of the flat web portion 25 of the contact clip 4. The soft solder layer 28 is a height equalisation or height compensation layer since, during the mounting process, the layer is flexible if mechanical pressure is exerted on the layer 28 by, for example, pressing the flat web portion 25 onto the drain electrode 6 or by pressing the drain electrode 6 onto the flat web portion 25. The soft solder layer 28 is flexible as during the soldering process as the solder is in the molten state and can flow laterally.

Consequently, the layer of diffusion solder 28 which provides the height equalising layer is provided with a thickness so that the total thickness of the MOSFET device 2, diffusion solder layer 20 and height equalising layer 28, i.e. the total (a+b+d) is greater than the height c of contact clip. Consequently, during the mounting process, when the contact clip 4 and MOSFET 2 are pressed together, the height of the layer 20 gate is reduced to a thickness d' so that the total height (a+b+d'), is equalised to essentially the depth of contact clip defined as c.

In a further embodiment, a second height compensation layer 33 is positioned on the lower surface 31 of the foot region 30 of the contact clip 4. The second height compensation layer 33 also comprises soft solder and is applied with a thickness e. This layer 33 enables the contact clip 4 to be mounted on the drain portions 13 leadframe 3. In this embodiment, the thickness, e, of the second height compensation layer 33 will be reduced to e' during the mounting process so that the distance (c+e') is approximately equal to (a+b+d'), as illustrated in FIG. 2.

The diffusion solder bond joints 20 between the electrically conductive bumps 18,19 and the leadframe 3 are formed in a first stage of the assembly method. After the diffusion solder bonds 20 have been made, the contact clip 4 is fixed onto the upper free-lying second side 5 by the height compensation layer 28 which comprises soft solder. The diffusion bond 20 are thermally and mechanically stable at the temperature at which solder reflow typically occurs, between 200° C. and 250° C. Consequently, the diffusion solder bonds 20 maintain their thickness. Further movement between the MOSFET device 2 and the leadframe 3 is, therefore, prevented.

The MOSFET device 2, electrically conductive bumps 18, 19, upper surface 15 of the leadframe 3 and peripheral rim portions of the contact clip 4 are embedded in a plastic encapsulation compound 34. The central region of the flat web portion of the contact clip 4 remains uncovered by the encapsulation compound 34 and the outer contact areas 17 of the electronic component also remain free from the plastic encapsulation compound 34.

As can be seen in FIG. 1, the surface mountable contact surfaces 17 provided by the lower surfaces 16 of the leadframe 3 are essentially coplanar and are mounted on, and electrically connected to, the printed circuit board 10 by soft solder 32. The lower outer surfaces 16 of the leadframe 3 also include an easily solderable layer 99.

The electronic component 1 is mounted on the PCB 10 by soft solder connections 32. Since the electrically conductive bumps 18, 19 and, therefore, the gate electrode 9 and source electrode 8 are connected to the leadframe 3 by diffusion solder bonds 20, these connections do not melt during the solder process to mount the electronic component 1 on the PCB 10.

In a further embodiment not illustrated in the figures, the source electrode 8 and gate electrode 9 are each provided by a single layer and do not comprise a plurality of protrusions. The outermost surface 24 of each of the source electrode 8 and gate electrode 9 is, therefore, of essentially the same size as the lateral extent of the electrode on the first side 7 of the MOSFET device 2.

The electronic component 1 is manufactured by providing a semiconductor wafer including a plurality of MOSFET devices 2 arranged in rows and columns.

The drain electrode 6 is deposited on a second surface 5 of the wafer in each of the plurality of device positions. The source electrode 8, gate electrode 9 of each of the plurality of MOSFET devices 2 are then deposited on first surface 7 of the wafer and the electrically conductive bumps 18, 19 deposited on the source electrode 8 and gate electrode 9 respectively as previously described.

A leadframe 3 is provided which has the form of a structured metal sheet comprising a plurality of device positions, each device position providing a leadframe 3 for a single electronic component. In an embodiment, the leadframe 3 comprises a source portion 12, a gate portion 11 and two drain portions 13 in each of the device positions.

The leadframe 3 is then heated to a temperature above the melting point of the diffusion solder and the first surface 7 of the MOSFET device 2 is aligned facing the upper surface 15 of leadframe 3 such that the gate electrode 9 is positioned above the gate portion 11 and the source electrode 8 is positioned above the source portion 12. The diffusion solder layer 21 positioned on the outer surface of each of the spacing elements 18, 19 is brought into contact with the upper surface 15 of the respective portion of the leadframe 3. Intermetallic phases are formed between the material of the diffusion solder 21 and the leadframe 3 which have a higher melting point than the melting point of the diffusion solder. The MOSFET device 2 is, therefore, attached to the gate portion 11 and source portion 12 of the leadframe 3 by the solidification of the interface between the electrically conductive bumps 18, 19 and the leadframe 3. The gate portion 11 and source portion 12 of the leadframe 3 therefore provide the chip carrying portions of the leadframe 3.

A contact clip 4 is provided which comprises a flat web portion 25 and two peripheral rim portions 26 which extend on two opposing sides of the flat web portion 25. The flat web portion 25 is provided with an area so that the peripheral rim portions 26 extend over and beyond the side faces 23 of the semiconductor power switch 2 and are not in contact with the side faces 23. Each peripheral rim portion 26 comprises a leg 29 and foot 30.

The contact clip 4 is provided with a depth, c, such that vertical distance between the lower surface 31 of the foot 30 of the peripheral rim portion 26 and the flat web portion 25 is greater than the total thickness of the MOSFET 2 and diffusion solder layer 20.

A layer of diffusion solder 28 is positioned on the lower surface 27 of the flat web portion 25 and has a thickness d. The MOSFET device 2 is positioned between the two opposing peripheral rim portions 26 of the contact clip 4 and the drain electrode 6 pressed into the diffusion solder layer 28, reducing the thickness of the diffusion solder layer 28 until the outermost surfaces of the diffusion solder layer 20, which is positioned on the contact bumps 18, 19 of the source electrode 8 and gate electrode 9, respectively, are essentially coplanar with the lower surface 31 of the foot regions of the contact clip 4.

Alternatively, the contact clip 4 is pressed onto the upper surface 5 of the MOSFET device 2, reducing the thickness of the solder layer 28 while the lower surfaces 31 of the two foot regions 30 also brought into contact with the upper surface 15 of the two drain portions 13 of the leadframe 3. In each case, the contact clip 4 provides an electrical connection between the drain electrode 6 and the drain portions 13 of the leadframe 3.

The electronic component 1 is then encapsulated using a transfer molding process. The outer contact surfaces 17 and upper surface of the flat web portion 25 of the contact clip 4 remain exposed from the plastic encapsulation compound 34.

FIG. 3 illustrates an electronic component 35 according to a second embodiment. The electronic component 35 also includes a vertical power MOSFET device 2 with electrically conductive bumps 18, 19 positioned on the first surface.

The electronic component 35 differs from the electronic component 1 illustrated in FIG. 1 in that a leadframe is not provided. Parts of the electronic component 35 which are essentially the same as, or perform essentially the same function as, those in FIGS. 1 and 2 are denoted with the same reference number.

In the electronic component 35, the drain electrode 6 is mounted to the lower surface 27 of the flat web portion 25 of the contact clip 4 by a diffusion solder bond 20. The electrically conductive bumps 18, 19 which are positioned on the source electrode 8 and gate electrode 9, respectively, are provided with a layer of soft solder 28. The layer of soft solder 28 is a height equalisation layer.

In this embodiment of the invention, the drain electrode 6 is first mounted to the lower surface 27 of the flat web portion 25 by a diffusion solder process. Afterwards, the layer of soft solder 28 is positioned on the outer surfaces 24 of the electrically conductive bumps 18, 19 and on the lower surface 31 of the foot region 30 of the contact clip 4. The electronic component 35 and mounted on printed circuit board 10 by bringing the soft solder layer 28, 33 into surface to surface contact with contact surfaces provided on the upper surface of the printed circuit board 10 and performing a solder reflow process. Since the soft solder layers 28, 33 melt during the solder reflow process, the thickness of these two layers may be reduced and the reduction in the thickness of each layer 28, 33 may be different so as to compensate for any height differences between the lower surfaces 31 of the foot regions 30 and the outermost surfaces 24 of the contact bumps 18, 19. The electronic component 35 may, therefore, be surface mounted on the printed circuit board 10 more reliably.

The drain electrode 6 is attached to, and electrically connected to contact clip 4 by the diffusion solder bond 20. The diffusion solder bond 20, therefore, remains thermally a mechanically stable during the second stage during which the electronic component 35 is mounted onto the printed circuit board 10.

The printed circuit board 10 includes contact areas 36 on its upper surface which have an arrangement which corresponds to the arrangement of the plurality of first electrically conductive bumps 18 which provide the outer contact areas 17 of the source electrode 8 and the second electrically conductive bump 19 which provides the outer contact surface 17 of the gate electrode 9.

The PCB 10 comprises a gate contact area 40, a source contact areas 41 and two drain contact areas 42 whose size and arrangement corresponds to the arrangement of the electrically conductive bumps 18, 19 and contact clip 37. The height compensation layer 28 positioned on the distal end 24 of the electrically conductive bumps 18, 19 is in direct contact with the contact surfaces 36 of the PCB 10.

The lower surface 38 of each foot 30 of the contact clip 4 is mounted on a drain contact area 42 of the printed circuit board 10 by soft solder 33 which also acts as a height equalization layer.

The contact clip 4 is provided with a form such that the MOSFET device 2 is accommodated between the two inner surfaces of the two opposing peripheral rim portions 26. The leg 29 of the peripheral rim portion 26 extends a distance such that the lower surface 38 of the foot 30 is mounted on the upper surface 15 of the drain portion 36 of the printed circuit board 10 when the bottom surface 27 of the flat web portion 25 is mounted on the drain electrode 6. The total height of the contact clip and solder layer 33 is, therefore, equal to the total height of the MOSFET 2, diffusion solder bond 20 and height equalization layer 28.

The electronic component 35 is assembled by providing a PCB 10 which has contact areas 36 on its upper surface which provide a gate contact area 40, a source contact area 41 and two drain contact areas 42 with an arrangement corresponding to that of the MOSFET device 2 and contact clip 37.

A vertical power MOSFET device 2 is provided which comprises a first surface 7 on which the gate electrode 9 and source electrode 8 are positioned. A drain electrode 6 is positioned on the opposing second surface 5 of the MOSFET device 2. A plurality of electrically conductive bumps 18, 19 are deposited on the anode 8 and gate electrode 9. A diffusion solder layer 20 is deposited on the upper surface of the drain electrode 6.

A contact clip 4 is provided with a size and from as previously described.

The contact clip 410 is heated to a temperature above the melting point of the diffusion solder. The MOSFET device 2 is aligned with the contact clip and the drain electrode 6 is brought into contact with the lower surface 27 of the flat web portion 25. The MOSFET device 2 is mounted on, and electrically connected to, the contact clip 4 due to the formation of intermetallic phases between the diffusion solder and the contact clip to produce diffusion solder bond 20.

A layer of diffusion solder 28 is applied to the outermost surfaces 24 of the electrically conductive bumps 18, 19 and to the lower surface 31 of the foot regions 30. The contact clip 37 is positioned so that the peripheral rim portion 38 is in contact with the upper surface of the drain contact area 42 of PCB 10, the source electrode 6 is in contact with the source contact surface 41 and the gate electrode 9 is in contact with the gate contact surface 40. A solder reflow process is performed to attach the electronic component 35 to the PCB 10. The electronic component 35 can, therefore, be mounted on the PCB 10 without causing the diffusion solder bonds 20 attaching the MOSFET 2 to the contact clip 4 to melt.

Figure 4:
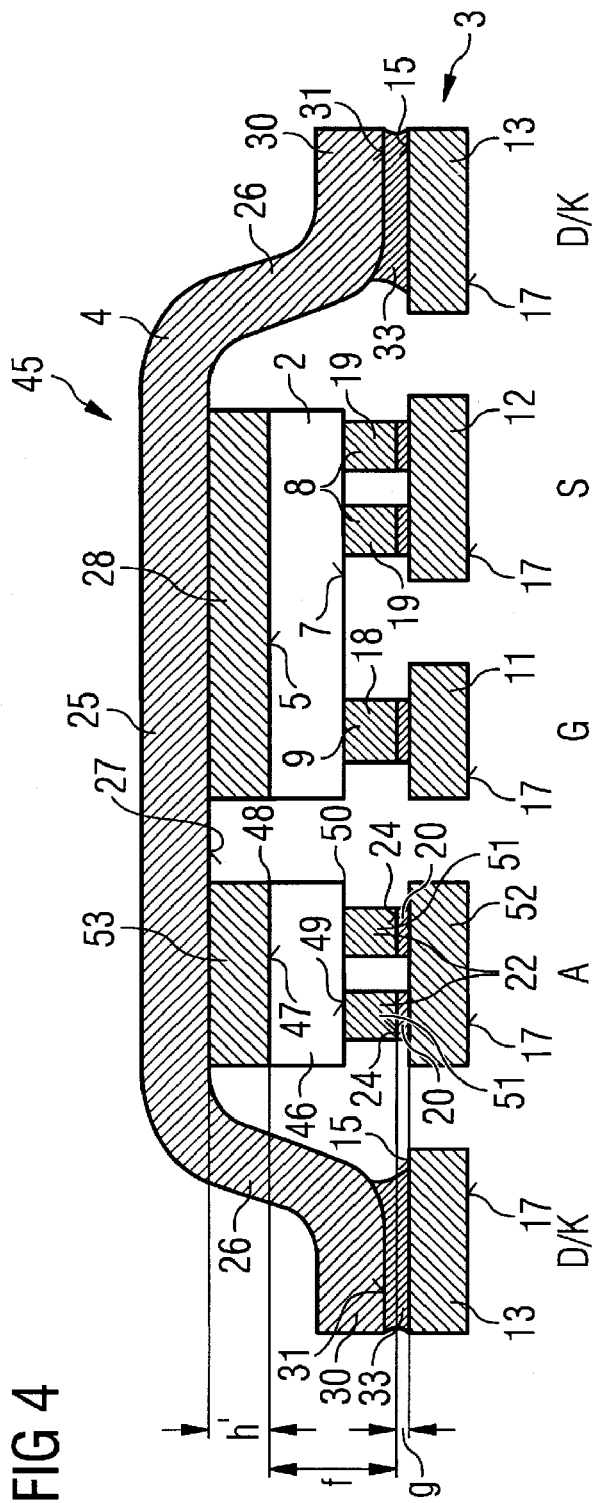
FIG. 4 illustrates a cross-sectional view of an electronic component according to a third embodiment.

FIG. 4 illustrates an electronic component 45 according to a third embodiment. The electronic component 45 comprises, in addition to a MOSFET device 2, a vertical diode 46.

The MOSFET device 2 is essentially the same as that described and illustrated in connection with FIGS. 1 and 2. The diode 46 has a first side 47 which comprises a cathode 48, denoted in the figure as K, and a second side 49 which opposes the first side 47 and comprises an anode 50, denoted in the figure as A.

The anode 50 also comprises a plurality of electrically conductive bumps 51, each of which comprises a copper metal body 22 and an outermost diffusion layer 20 positioned on the distal end 24 of the metal body 22. The height of the electrically conductive bumps 51 is essentially the same as that of the electrically conductive bumps 18, 19 positioned on the gate electrode 8 and source electrode 9 of the MOSFET device 2.

The leadframe 3 of the electronic component 45, further comprises an anode portion 52 in addition to the gate portion 11, source portion 12, and two drain portions 13. The node portion 52 is positioned between the gate portion 11 and drain portion 12 so that the diode 46 is positioned adjacent the MOSFET device 2 in the electronic component 45. The two drain portions 13 simultaneously provide the cathode connections of the diode 46.

The anode 50 of the diode 46 is mounted on the upper surface 15 of the anode portion 52 of the leadframe 3 by diffusion solder bonds 20 which are positioned directly between the metal body 22 of the plurality of electrically conductive contact bumps 51 and the upper surface 15 of the anode portion 52. The cathode 48 of the diode 46, therefore, faces upwards away from the upper surface 15 of the leadframe 3 and towards the lower surface 27 of the contact clip 4.

The cathode 48 is mounted on, and electrically connected to, the lower surface 27 of the flat web portion 25 of the contact clip 4 by a layer of diffusion solder 53 which is a height compensation layer. The diode 46 is, therefore, mounted adjacent to the MOSFET device 2 on the flat web portion 25 of the contact clip 4. The cathode 48 of the diode 46 is electrically connected in series with the drain electrode 6 of the MOSFET device 2 by the contact clip 4. The cathode 48 of the diode 46 is, therefore, electrically connected to the drain portions 13 of the leadframe 3 by the contact clip 4.

Figure 5:
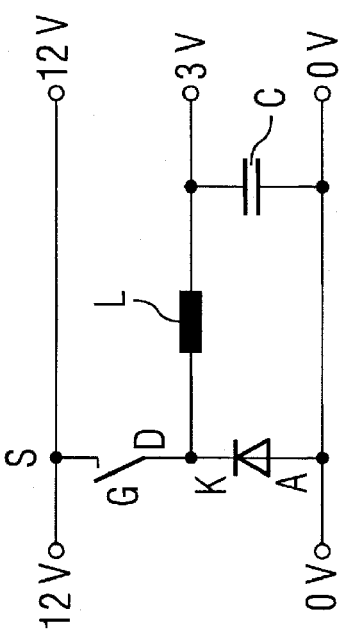
FIG. 5 illustrates the circuit provided by the electronic component of FIG. 4.

The circuit provided by the electronic component 45 is illustrated in FIG. 5. The circuit also includes an inductance, denoted L, and a capacitance, denoted C. The drain electrode D of the transistor is connected in series with the cathode K of the diode. The drain electrode and cathode of the diode lie at the same potential. The source electrode being at high potential and the anode of the diode being at ground.

The height compensation layer 53 has a thickness h' such that the outermost surface of the diffusion solder layer 20 of the anode 50 is essentially coplanar with the outermost surface of the diffusion solder layer 20 of the gate electrode 9 and source electrode 8 of the MOSFET device 2. The thickness of the height compensation layer 53 arranged on the cathode of the diode may, therefore, be different to the thickness of the height compensation layer 28 positioned on the drain electrode 6 of the MOSFET 2. If the diode has a thickness denoted as f between the outermost surface of the anode 50 and the outermost surface of the cathode 48, and the diffusion solder bond 20 has a thickness g, then the thickness of the height compensation layer 53 is h' so that the total $(f+g+h') \approx (c+e')$ Electronic component 45 is produced by providing a leadframe 3 with five portions providing the electronic component 45 with two drain cathode portions 13, an anode portion 52, a gate portion 11 and a source portion 12. A vertical power MOSFET device 2 is provided as previously described with reference to FIGS. 1 and 2. The vertical diode 46 is provided which has a first side 47 comprising a cathode 48 and a second side 49 comprising an anode 50. A plurality of electrically conductive bumps 51 are positioned on the anode 50, each electrically conductive bump comprising a copper body 22 with a layer of diffusion solder 20 positioned on its distal end 24.

The leadframe 3 is heated up to a temperature above the melting point of the diffusion solder. The diffusion solder layer 20 positioned all of the distal ends 24 of the plurality of electrically conductive bumps 18, 19 positioned on the second surface 7 of the MOSFET device 2 is brought into surface to surface contact with the upper surface 15 of the leadframe 3 so that the gate electrode 8 is mounted on the gate portion 11 of the leadframe 3 and the source electrode 9 is mounted on the source portion 12 of the leadframe 3.

The diode 46 is then positioned with its second side 49 facing towards the upper surface 15 of the node portion 52 of the leadframe 3. The diffusion solder layer 20 positioned on the distal end 24 of the plurality of electrically conductive bumps 51 is brought into surface to surface contact with the upper surface 15 of the anode portion 52, while the leadframe 3 is at temperature above the melting point of the diffusion solder, and pressed into the upper surface 15. Intermetallic phases are formed at the interface between the diffusion solder layer and the anode portion 52 to mount the diode 46 on to the anode portion 52 and electrically connect the anode 50 of the diode 46 to the anode portion 52.

A first height equalisation layer 28 of thickness d and comprising electrically conductive adhesive is positioned on the drain electrode 6 of the MOSFET device 2. A second height equalisation layer 53 of thickness h also comprising electrically conductive adhesive is positioned on the cathode 48 of the diode 46. A further layer of electrically conductive adhesive 33 of thickness e is positioned on the upper surface 15 of the two drain portions 13 of the leadframe 3.

The contact clip 4 is then bought into contact with the outermost surface of the height equalisation layers 28, 53, 33 and pressed downwards onto the diode 46, MOSFET device 2 and two drain portions 13 of the leadframe 3 in order to electrically connect the cathode 48 and drain electrode 6 to the drain portions 13. The height of thickness of the height equalisation layers 28, 33 and 53 is reduced from d to d', e to e' and h to h', respectively, during this process so that $(c+e') \approx (a+b+d') \approx (f+g+h')$.

REFERENCE NUMBERS 1 first electronic component
2 MOSFET device
3 leadframe
4 contact clip
5 second upper side
6 drain electrode
7 first lower side
8 source electrode
9 gate electrode
10 printed circuit board
11 gate portion of leadframe
12 source portion of leadframe
13 drain portion of leadframe
14 foot region of contact clip
15 upper surface of gate portion and source portion
16 lower surface of source portion and gate portion
17 outer contact area of electronic component
18 first electrically conductive bump
19 second electrically conductive bump
20 diffusion solder bond
21 side surfaces of electrically conductive bump
22 metal body of electrically conductive bump
23 side face of MOSFET
24 distal end of electrically conductive bump
25 flat web proportion
26 peripheral rim portion
27 lower surface of flat web portion
28 soft solder layer
29 leg
30 foot
31 lower surface of foot
32 soft solder layer
33 solder wettable layer
34 plastic encapsulation compound
35 second electronic component
36 contact areas of PCB
40 gate contact area of PCB
41 source contact area of PCB
42 drain contact area of PCB
45 third electronic component
46 diode
47 first side
48 cathode
49 second side
50 anode
51 electrically conductive bump
52 anode portion of leadframe
53 second height equalization layer

What is claimed is:

1. A method comprising:

providing at least one vertical semiconductor power device comprising a first side and a second side opposing the first side, wherein the first side comprises at least one first load electrode and the second side comprises at least one second load electrode, the vertical semiconductor power device having a height between the outermost surfaces of the first load electrode and the second load electrode of a, wherein a layer of diffusion solder is positioned on the first load electrode and comprises a thickness b;

providing a contact clip comprising a flat web portion having a lower surface, the flat web portion extending into a peripheral rim portion having a foot having a lower foot surface, wherein a height c is provided between the lower surface of the flat web portion and the lower foot surface;

providing a substrate comprising at least one die support region and at least one substrate contact surface, the upper surface of the die support regions and of the contact surfaces being generally coplanar;

attaching the first load electrode of the semiconductor power device to a first die support region by a diffusion solder process to produce a diffusion solder bond comprising a plurality of intermetallic phases;

providing an electrically conductive height equalization layer comprising a thickness d on the second load electrode, wherein $(a+b+d) > c$;

after the diffusion solder process is completed, attaching the lower surface of the flat web portion to the second load electrode and with the electrically conductive height equalization layer and the lower foot surface to the substrate contact surface; and pressing the contact clip and adjusting the thickness of the height equalization layer to d', wherein d'<d, so that c is approximately equal to (a+b+d').

2. A method according to claim 1, wherein soft solder is provided as the height equalization layer and the thickness d is adjusted by heating the soft solder above its melting point while pressing the contact clip onto the height equalization layer.

3. A method according to claim 1, wherein electrically conductive adhesive is provided as the height equalization layer.

4. A method according to claim 1, wherein the vertical semiconductor power device further comprises a control electrode positioned on the first side and a diffusion solder layer is positioned on the control electrode and comprises a thickness b.

5. A method according to claim 4, wherein the control electrode is attached to a second die support region during the diffusion solder process.

6. A method according to claim 1, wherein a further height equalization layer is positioned on the lower foot surface of the peripheral rim portion of the contact clip.

7. A method comprising:

providing at least one vertical semiconductor power device comprising a first side and a second side opposing the first side, wherein the first side comprises at least one first load electrode and the second side comprises at least one second load electrode, the vertical semiconductor power device having a height between the outermost surfaces of the first load electrode and the second load electrode of a, wherein a layer of diffusion solder is positioned on the first load electrode and comprises a thickness b;

providing a contact clip comprising a flat web portion having a lower surface, the flat web portion extending into a peripheral rim portion having a foot having a lower foot surface, wherein a height c is provided between the lower surface of the flat web portion and the lower foot surface;

providing a substrate comprising at least one die support region and at least one substrate contact surface, the upper surface of the die support regions and of the contact surfaces being generally coplanar, attaching the first load electrode of the semiconductor power device to a first die support region by a diffusion solder process;

providing an electrically conductive height equalization layer comprising a thickness d on the second load electrode, wherein (a+b+d)>c;

after the diffusion solder process is completed, attaching the lower surface of the flat web portion to the second load electrode and with the electrically conductive height equalization layer and the lower foot surface to the substrate contact surface; and pressing the contact clip and adjusting the thickness of the height equalization layer to d', wherein d'<d, so that c is approximately equal to (a+b+d'), wherein a second vertical semiconductor power device having a first surface and a second surface opposing the first surface is provided, wherein the first side comprises at least one first load electrode and a second side comprises at least one second load electrode, the second vertical semiconductor power device having a height between the outermost surfaces of the first load electrode and the second load electrode of f and wherein a layer of diffusion solder is positioned on the first load electrode and comprises a thickness g, and wherein the second vertical semiconductor power device is mounted on a third die support region of the substrate by bringing the diffusion solder layer into surface to surface contact with the third die support region and performing a diffusion solder process to form a diffusion solder bond before a height equalization layer comprising a thickness h is positioned on the second load electrode and the second load electrode attached to the lower surface of the contact clip by the height equalization layer, the contact clip being pressed so as to adjust the thickness of the height equalization layer to a thickness h', wherein h'<h, so that c is approximately equal to (f+g+h').

8. A method according to claim 7, wherein the first semiconductor power device is a transistor device and the second semiconductor power device is a diode.

9. The method of claim 7, wherein the diffusion solder comprises a plurality of intermetallic phases.

* * * * *